United States Patent
Lee et al.

(10) Patent No.: US 10,819,304 B2
(45) Date of Patent: Oct. 27, 2020

(54) APPARATUS FOR DISCARDING POWER NOISE, AND APPARATUS FOR CONVERTING AUDIO SIGNAL

(71) Applicant: DREAMUS COMPANY, Seoul (KR)

(72) Inventors: Jeong Ho Lee, Gwacheon (KR); Seung Ho Yu, Incheon (KR); Ji Heon Ahn, Yongin (KR); Woo Suk Kim, Bucheon (KR)

(73) Assignee: DREAMUS COMPANY, Seoul (KR)

( * ) Notice: Subject to any disclaimer, the term of this patent is extended or adjusted under 35 U.S.C. 154(b) by 0 days.

(21) Appl. No.: 16/500,784

(22) PCT Filed: Jun. 12, 2017

(86) PCT No.: PCT/KR2017/006096
§ 371 (c)(1),
(2) Date: Oct. 3, 2019

(87) PCT Pub. No.: WO2018/186530
PCT Pub. Date: Oct. 11, 2018

(65) Prior Publication Data
US 2020/0112788 A1 Apr. 9, 2020

(30) Foreign Application Priority Data

Apr. 7, 2017 (KR) .................. 10-2017-0045406
Jun. 9, 2017 (KR) .................. 10-2017-0072615

(51) Int. Cl.
*H04R 25/00* (2006.01)
*H03G 3/34* (2006.01)
(Continued)

(52) U.S. Cl.
CPC ............. *H03G 3/341* (2013.01); *G06F 3/165* (2013.01); *H03F 3/183* (2013.01); *H03F 3/185* (2013.01);
(Continued)

(58) Field of Classification Search
CPC ........ H04R 3/00; H04R 2499/11; H04R 3/14; G06F 3/165; H03F 3/185; H03F 3/21;
(Continued)

(56) References Cited

U.S. PATENT DOCUMENTS 3,239,763 A * 3/1966 Cistola ..................... H03K 3/37
327/118
4,860,185 A * 8/1989 Brewer ..................... G06F 1/28
363/41

(Continued)

FOREIGN PATENT DOCUMENTS

| JP | 2005025586 A | 1/2005 |
|----|--------------|--------|
| JP | 2010028784 A | 2/2010 |
| KR | 20060021153 A | 3/2006 |

OTHER PUBLICATIONS

International Search Report dated Dec. 28, 2017 for PCT Application No. PCT/KR2017/006096.

*Primary Examiner* — Khai N. Nguyen

(57) ABSTRACT

Embodiments provide a device for removing noise of a power source and an apparatus for converting an audio signal, which remove a noise component which comes from a power source terminal of an audio signal converting apparatus stepwise and transfer power to a converting unit and an amplification unit included in the audio signal converting apparatus from a power source terminal to remove power noise.

12 Claims, 16 Drawing Sheets

(51) Int. Cl.
*G06F 3/16* (2006.01)
*H04R 3/00* (2006.01)
*H03G 3/30* (2006.01)
*H03F 3/185* (2006.01)
*H03F 3/183* (2006.01)
*H03M 1/66* (2006.01)
*H04R 3/14* (2006.01)
*H05K 1/18* (2006.01)
*H03F 3/68* (2006.01)
*H03F 3/21* (2006.01)

(52) U.S. Cl.
CPC .......... *H03G 3/3089* (2013.01); *H03G 3/344* (2013.01); *H03G 3/348* (2013.01); *H03M 1/66* (2013.01); *H04R 3/00* (2013.01); *H04R 3/14* (2013.01); *H05K 1/181* (2013.01); *H03F 3/21* (2013.01); *H03F 3/68* (2013.01); *H03F 2200/03* (2013.01); *H05K 2201/10083* (2013.01)

(58) Field of Classification Search
CPC ........ H03F 3/68; H03F 2200/03; H03F 3/181; H03F 3/183; H03G 3/341; H03G 3/348; H03G 3/3089; H03G 3/344; H03M 1/66; H05K 1/181; H05K 2201/10083
USPC ...................... 381/71.1, 94.1, 94.5, 317, 323
See application file for complete search history.

(56) References Cited

U.S. PATENT DOCUMENTS

| | | | | |
|---|---|---|---|---|
| 5,907,622 A | * | 5/1999 | Dougherty | H03G 3/32 381/108 |
| 7,826,815 B2 | * | 11/2010 | Ajram | H02M 3/156 348/571 |
| 8,290,171 B1 | * | 10/2012 | Helfrich | H04R 5/033 381/111 |
| 8,306,244 B2 | * | 11/2012 | Okamura | H04R 1/005 381/111 |
| 8,571,509 B2 | * | 10/2013 | Ajram | H02M 3/156 348/571 |
| 9,130,455 B2 | * | 9/2015 | Nikitin | H02M 3/156 |
| 9,209,762 B1 | * | 12/2015 | Mortazavi | H03F 3/2171 |
| 9,712,260 B2 | * | 7/2017 | Yu | H04B 15/005 |
| 10,194,234 B2 | * | 1/2019 | Lu | H04R 1/1091 |
| 2008/0008330 A1 | * | 1/2008 | Tseng | H04R 3/007 381/59 |
| 2009/0004981 A1 | * | 1/2009 | Eliezer | H03F 1/0211 455/127.1 |
| 2009/0015215 A1 | * | 1/2009 | Ajram | H02M 3/156 323/234 |
| 2011/0014890 A1 | * | 1/2011 | Ajram | H02M 3/156 455/299 |
| 2013/0200843 A1 | * | 8/2013 | Tanabe | H04B 5/0037 320/108 |
| 2015/0022174 A1 | * | 1/2015 | Nikitin | H02M 3/156 323/282 |
| 2015/0030183 A1 | * | 1/2015 | Pazhayaveetil | H03G 3/004 381/120 |
| 2015/0071464 A1 | | 3/2015 | Du et al. | |
| 2015/0177754 A1 | * | 6/2015 | Mengad | G05F 1/56 323/280 |
| 2016/0197683 A1 | * | 7/2016 | Yu | H04B 15/005 381/94.6 |
| 2017/0019017 A1 | * | 1/2017 | Hawley | H02M 1/143 |
| 2017/0077882 A1 | * | 3/2017 | Wang | H03F 3/185 |
| 2018/0174724 A1 | * | 6/2018 | Gao | H01F 5/02 |
| 2018/0352321 A1 | * | 12/2018 | Lu | H04R 1/1091 |
| 2020/0036355 A1 | * | 1/2020 | Lee | H03G 3/3089 |
| 2020/0076371 A1 | * | 3/2020 | Zhang | H03F 3/20 |

\* cited by examiner

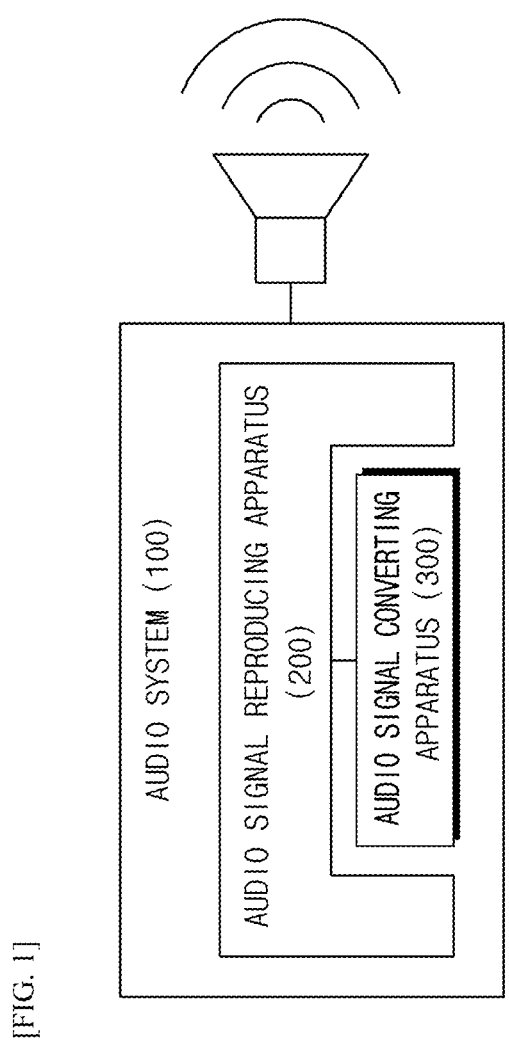
[FIG. 1]

[FIG. 2]
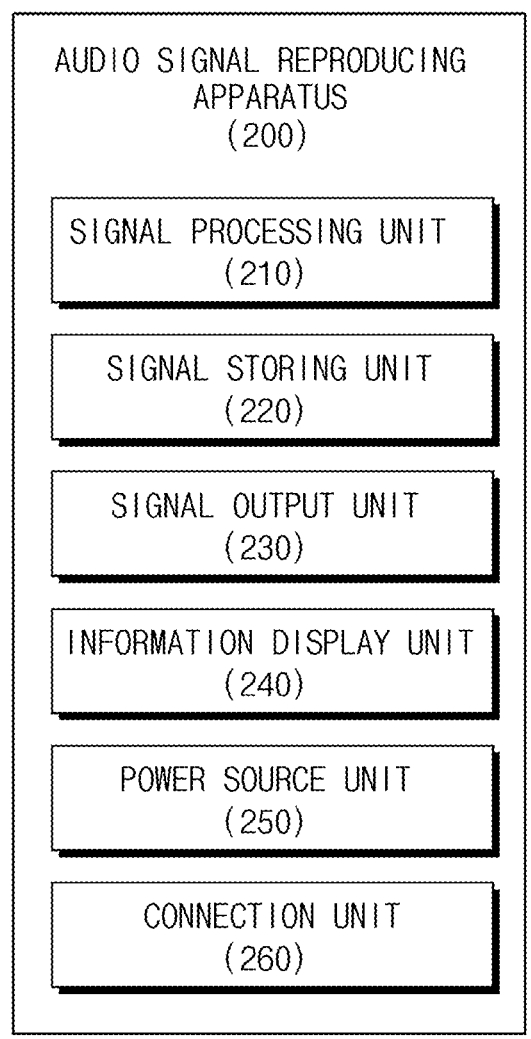

[FIG. 3]
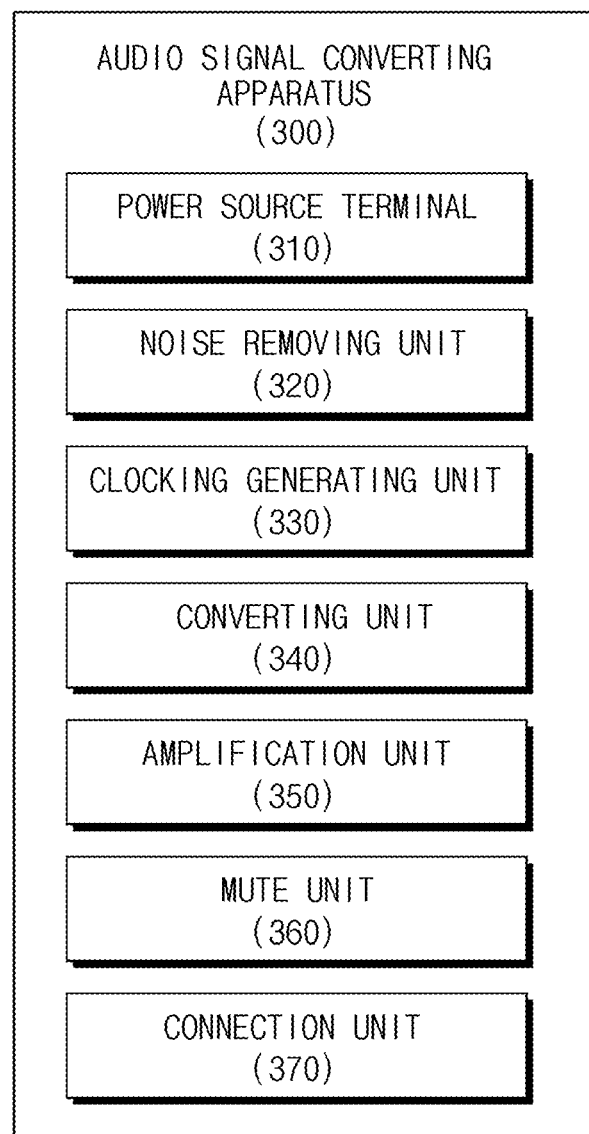

[FIG. 4]
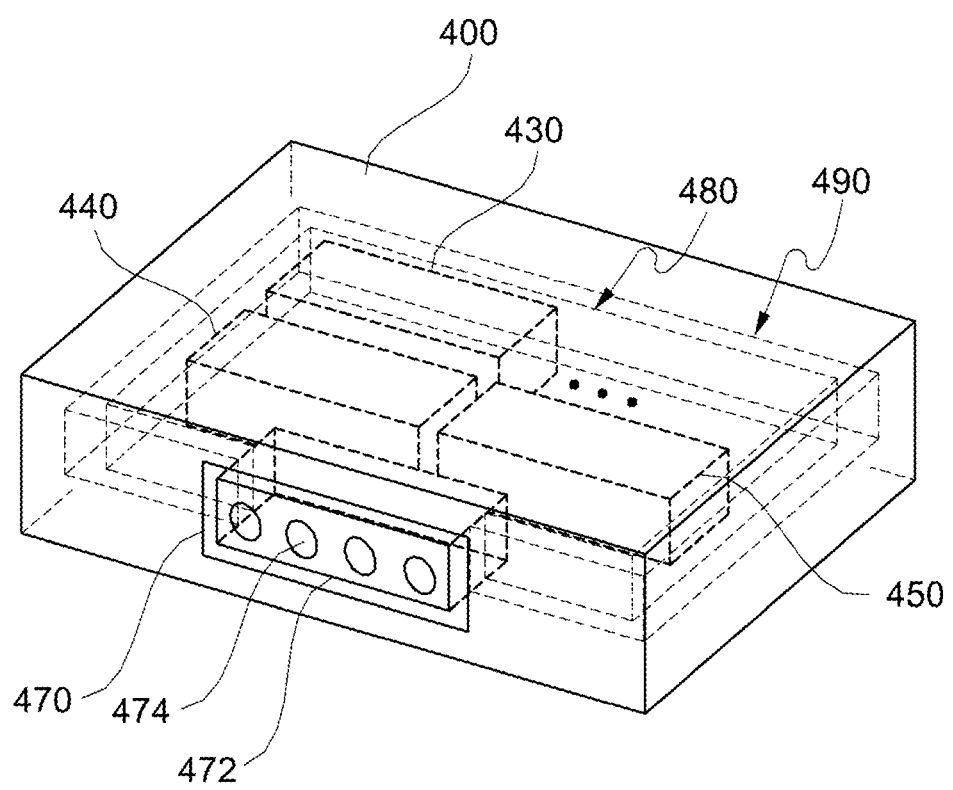

[FIG. 5]
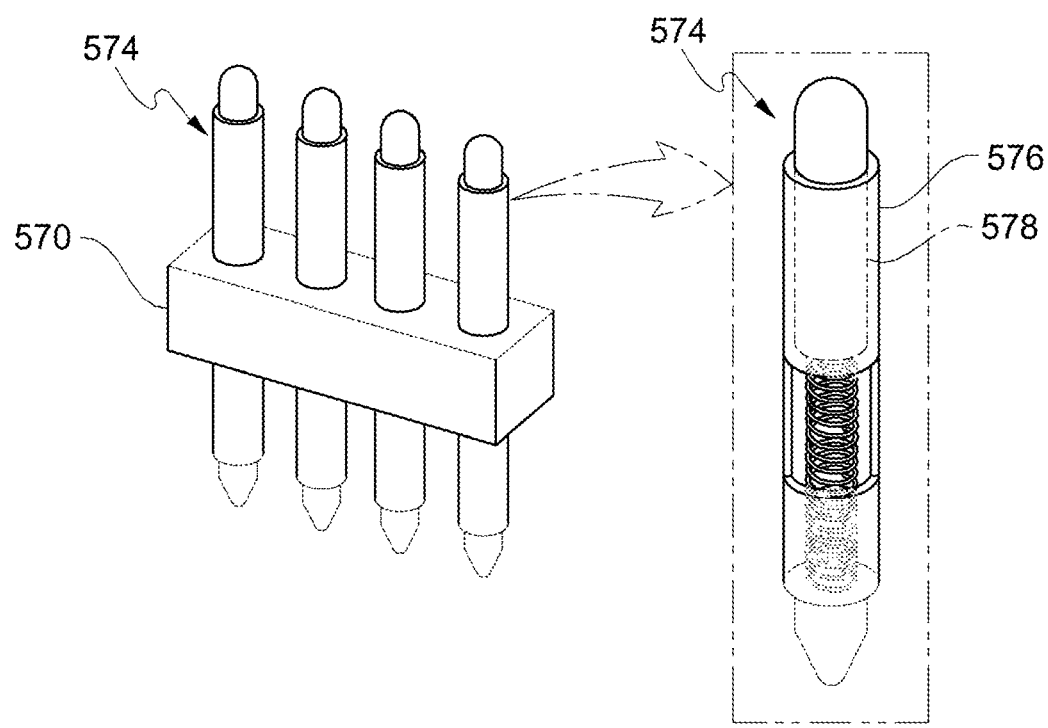

[FIG. 6]
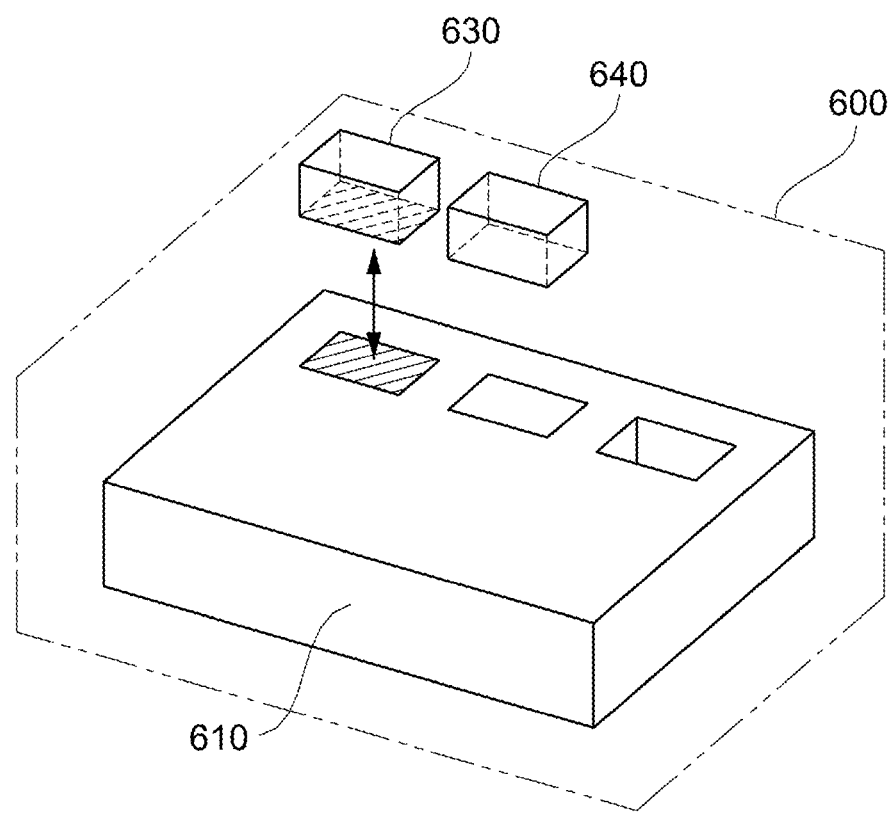

[FIG. 7]
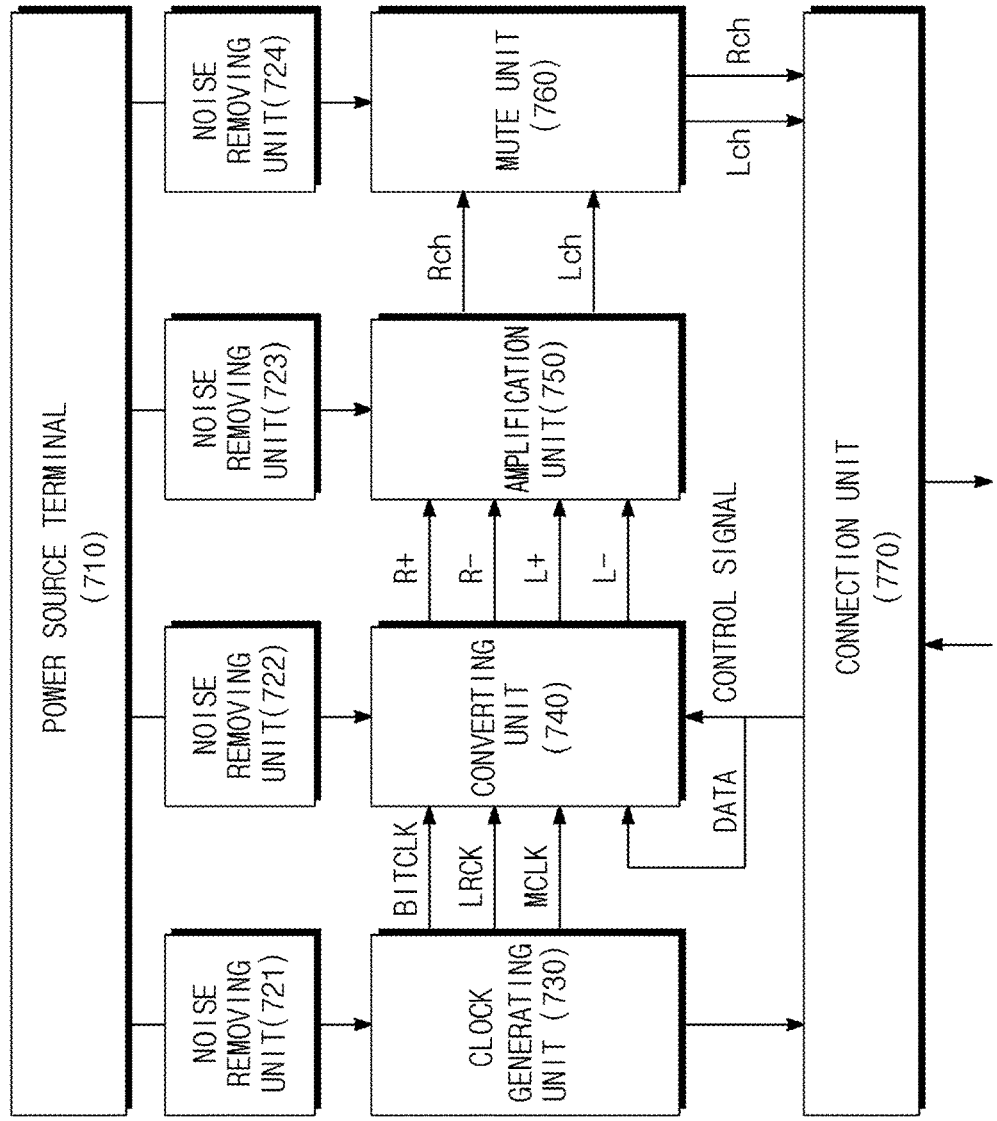

[FIG. 8]
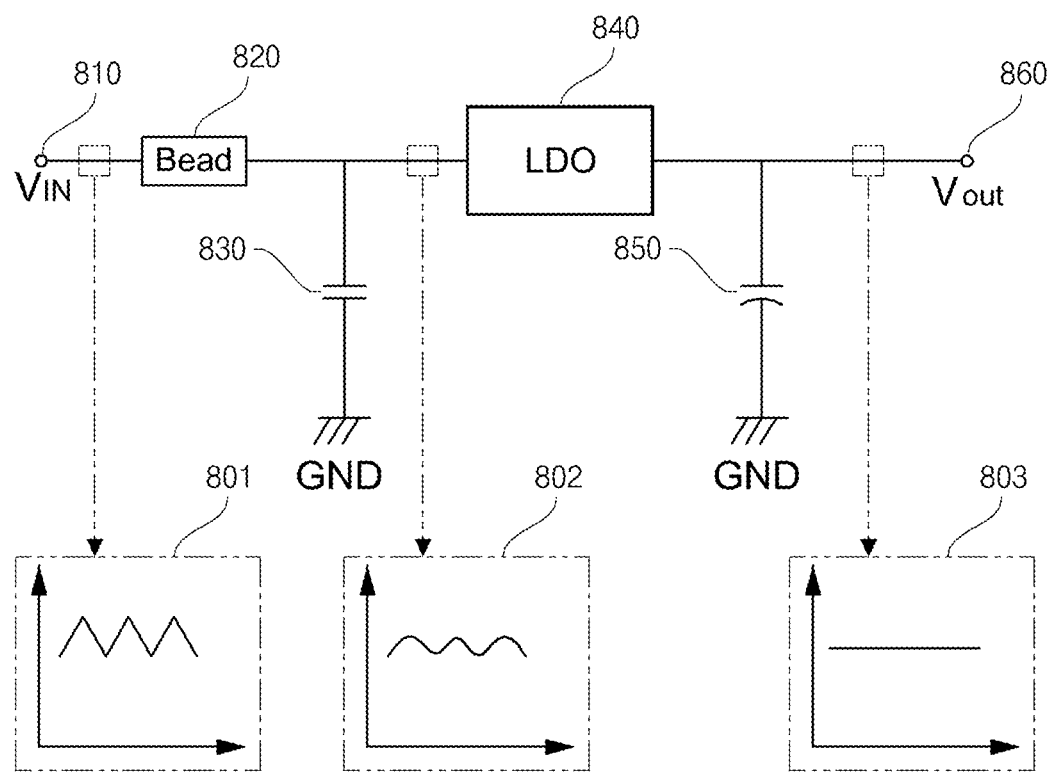

[FIG. 9]
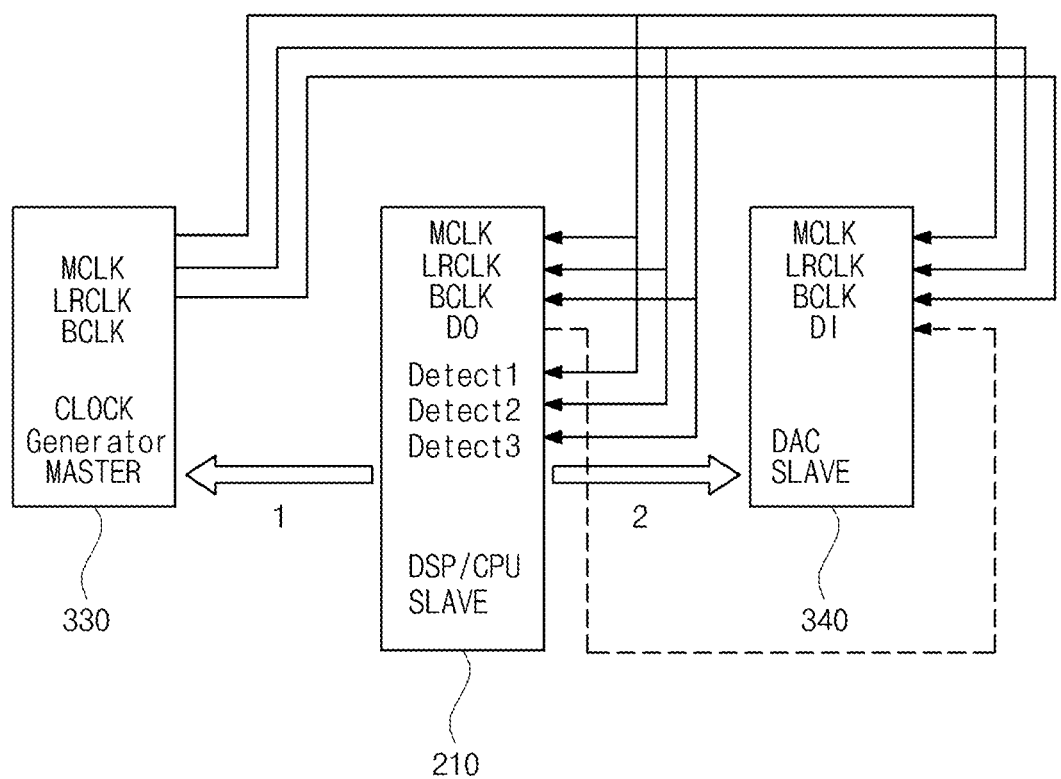

[FIG. 10]
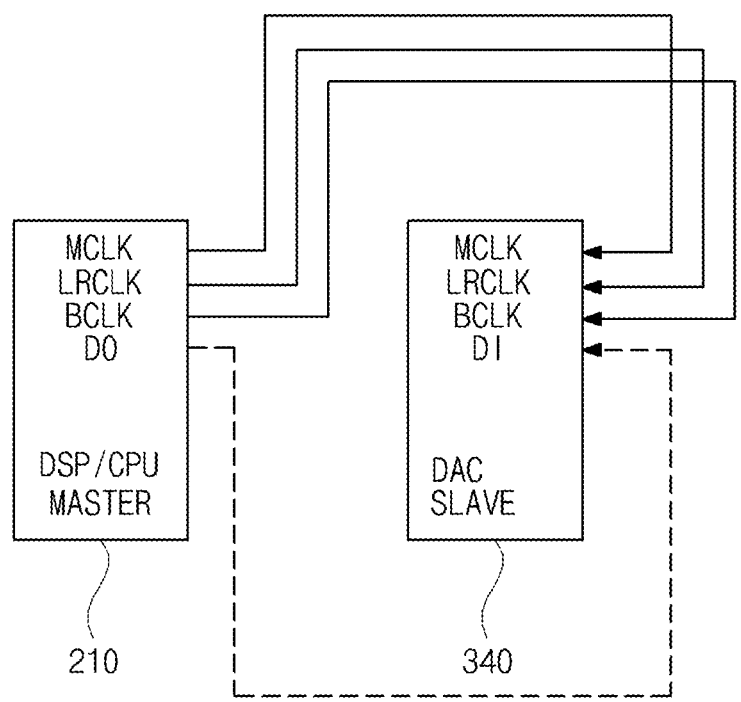

[FIG. 11]
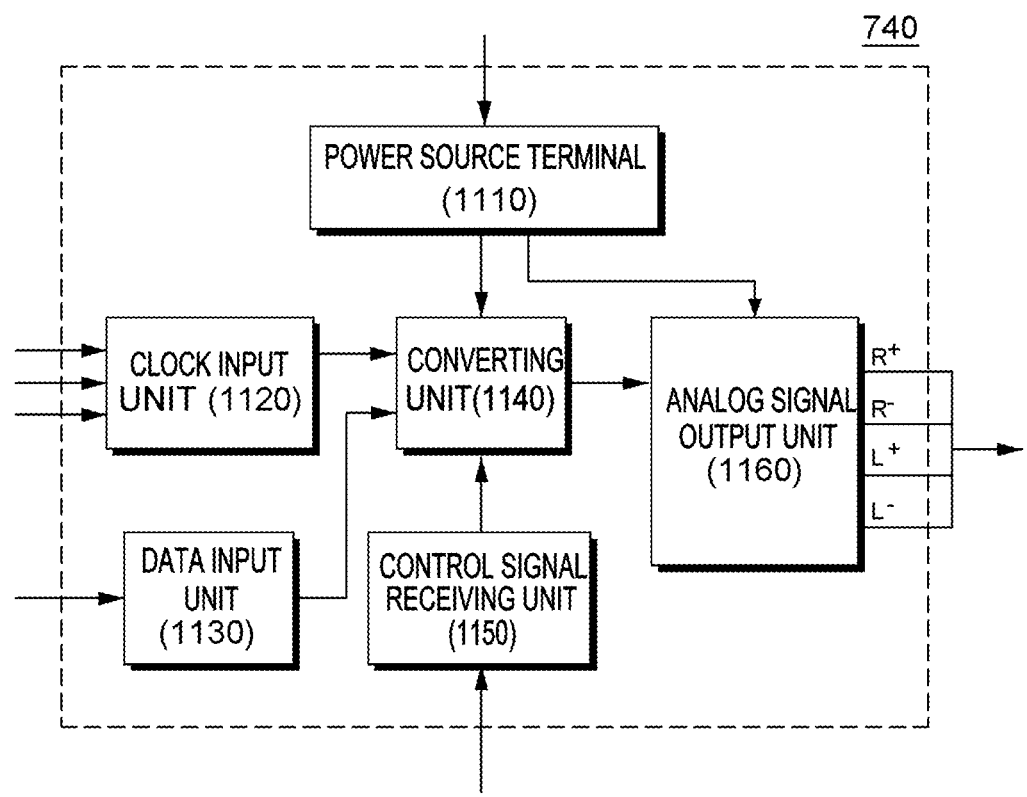

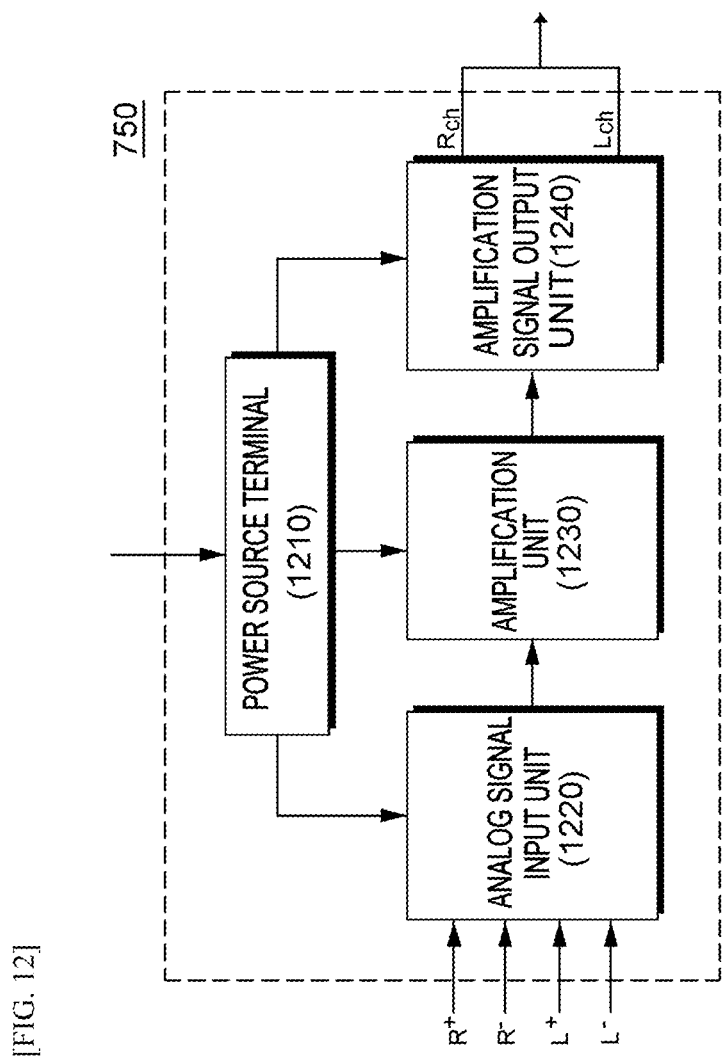

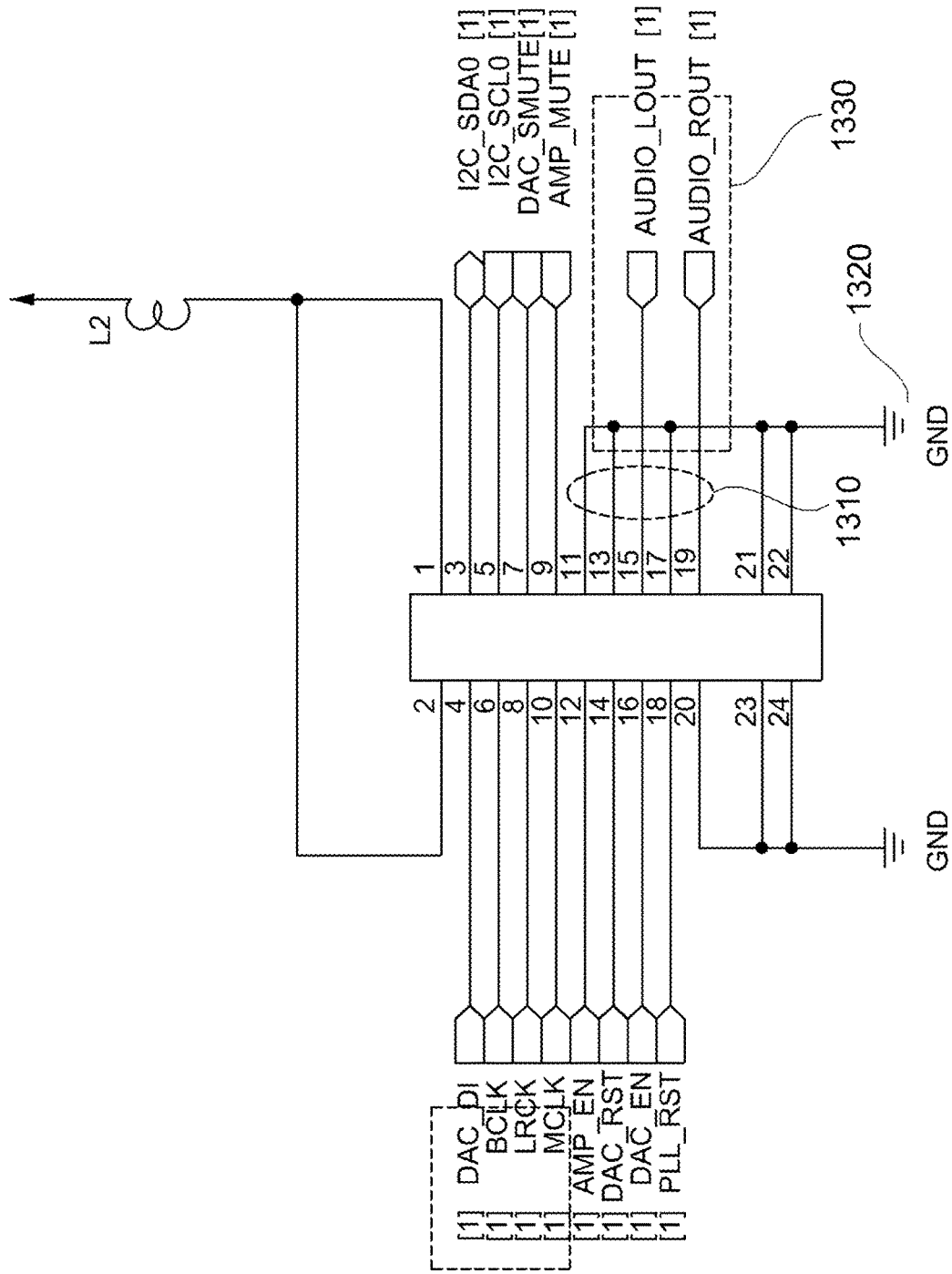
[FIG. 13]

[FIG. 14]
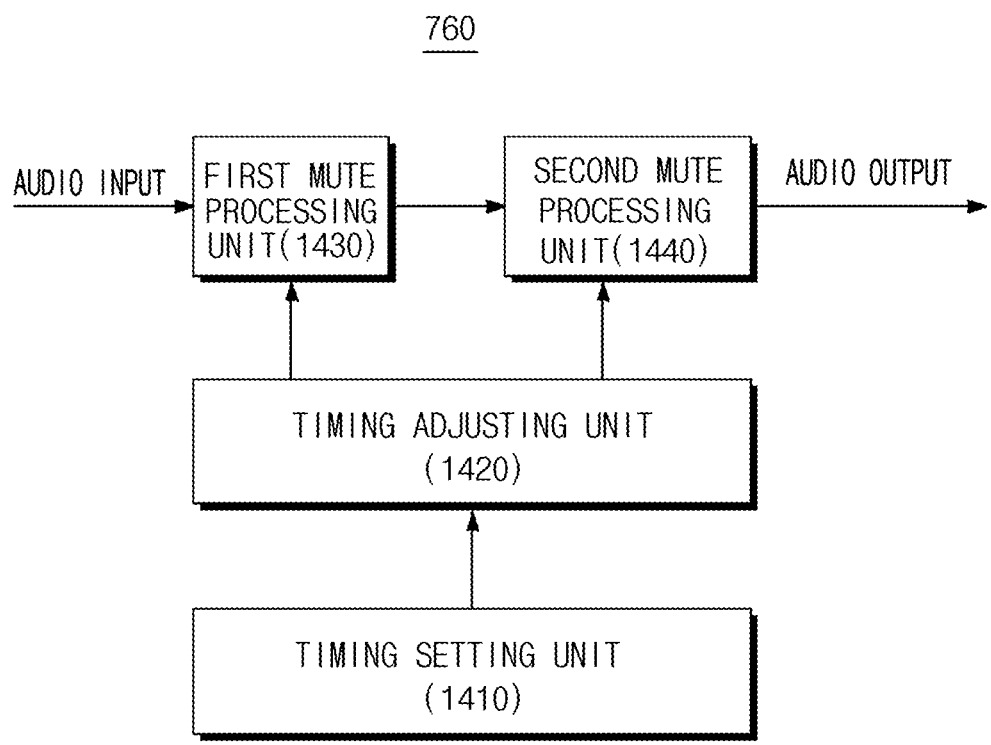

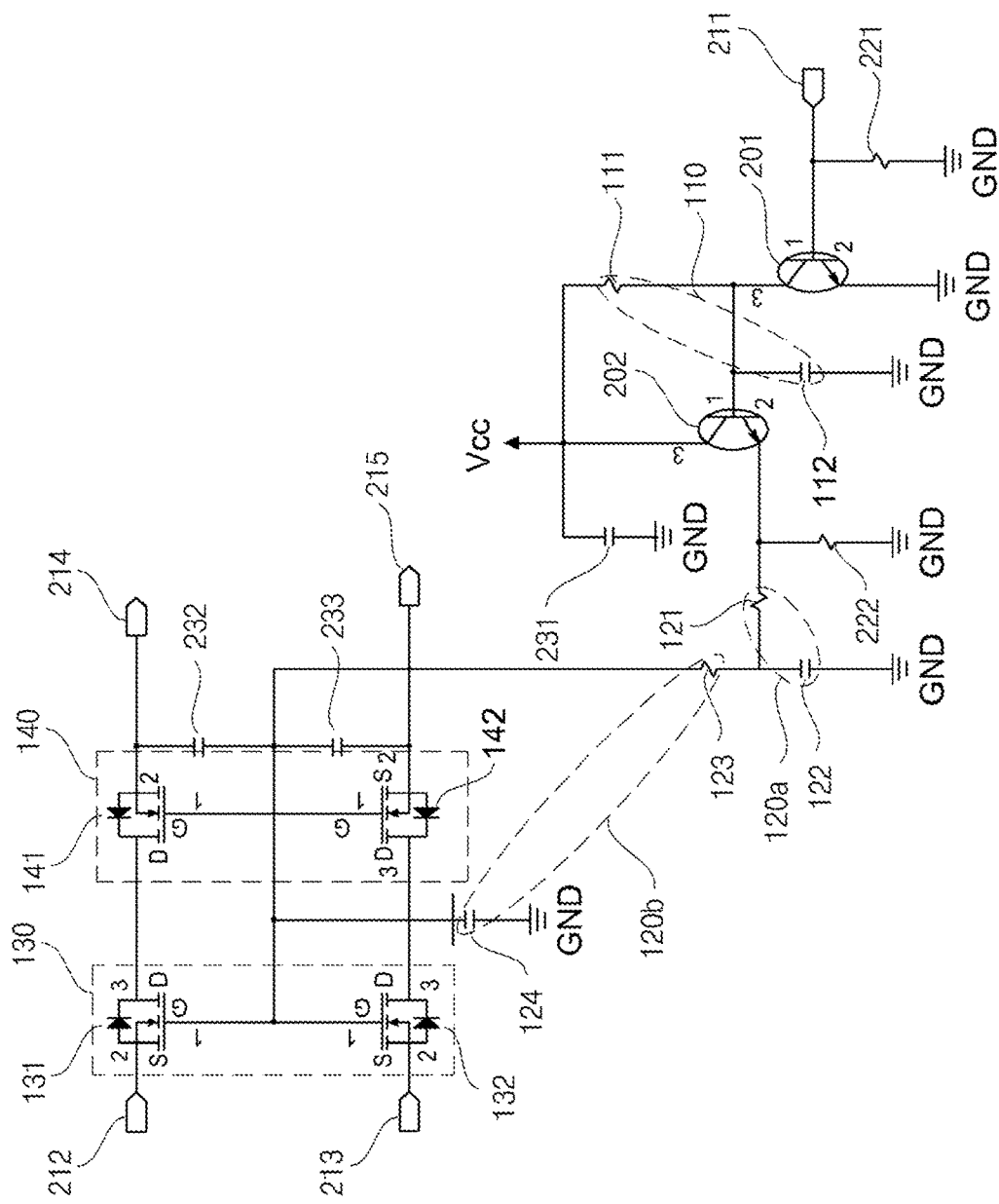
[FIG. 15]

[FIG. 16]
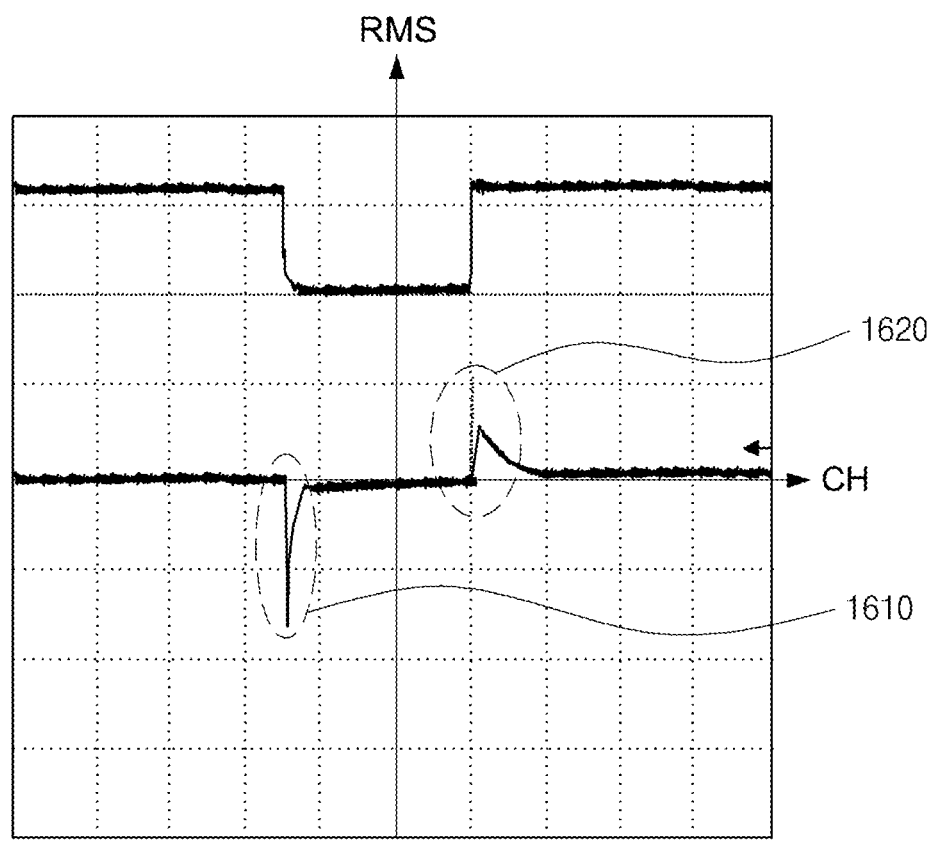

APPARATUS FOR DISCARDING POWER NOISE, AND APPARATUS FOR CONVERTING AUDIO SIGNAL

CROSS-REFERENCE TO RELATED APPLICATIONS

The present application is a U.S. National Stage of PCT/KR2017/006096 filed Jun. 12, 2017, which claims the priority benefit of Korean Patent Application No. 10-2017-0045406, filed on Apr. 7, 2017, and Korean Patent Application No. 10-2017-0072615, filed on Jun. 9, 2017, in the Korean Intellectual Property Office.

TECHNICAL FIELD

The embodiment relates to a device for removing a noise component from a power source in an audio system.

BACKGROUND ART

Contents described in this section merely provide background information on the present embodiment and do not constitute the related art.

An audio system is a system that generally converts sound waves in a sound range which people can hear, such as music, voice of people, a natural sound, etc., and an electrical signal acquired by converting the sound waves into sound wave energy and radiates the sound wave energy to a space.

A Hi-Fi audio is an audio device that can play a low-voice part to a high-voice part in the range of 16 to 20 kHz as an audible frequency of people uniformly and close to an original sound.

The Hi-Fi audio is very sensitive to noise. In particular, the Hi-Fi audio is vulnerable to power line noise which comes from a power source. That is, there is a problem in that a quality of an audio signal deteriorates due to the power line noise.

DISCLOSURE

Technical Problem

Embodiments of the present invention have been made in a main effort to effectively remove power noise as an apparatus for converting an audio signal to reproduce Hi-Fi audio has a noise removing unit which individually operates stepwise, a mute unit implemented by a pair of FETs, and a spaced wiring structure.

Other objects of the present invention, which are not explicitly described, may be additionally considered within the scope which can be easily deduced from the following detailed description and the effects thereof.

Technical Solution

According to an aspect of the embodiment, provided is a device for removing noise of a power source, which includes: a noise removing unit removing a noise component which comes from a power source terminal of an audio signal converting apparatus stepwise and transferring power to a converting unit and an amplification unit included in the audio signal converting apparatus from the power source terminal.

The power source terminal is separated into a plurality of power source terminals and there are a plurality of noise removing units, and the plurality of noise removing units are connected to the plurality of separated power source terminals, respectively to individually remove the noise component.

A first noise removing unit is connected between the converting unit and a first power source terminal and a second noise removing unit is connected between the amplification unit and a second power source terminal.

The noise removing unit includes a primary noise removing unit connected to a voltage input node, a secondary noise removing unit connected to the primary noise removing unit, a tertiary noise removing unit connected to the secondary noise removing unit, a quaternary noise removing unit connected to the tertiary noise removing unit, and a voltage output node connected to the quaternary noise removing unit.

The primary noise removing unit uses a bead for removing high-frequency noise. The secondary noise removing unit uses a capacitor having a serial equivalent resistance value lower than a predetermined value. The tertiary noise removing unit uses a low drop out (LDO) regulator. The quaternary noise removing unit uses a capacitor of a larger capacity than a predetermined value.

According to another aspect of the embodiment, provided is an apparatus for converting an audio signal, which includes: a power source terminal; a converting unit converting, when a digital audio signal is input, the digital audio signal into an analog audio signal; a clock generating unit determining an operation timing when converting the digital audio signal into the analog audio signal based on the digital audio signal; an amplification unit amplifying the analog audio signal; and a noise removing unit removing a noise component which comes from the power source terminal stepwise and transferring power to the clock generating unit, the converting unit, and the amplification unit from the power source terminal.

The audio signal converting apparatus is implemented as a module type and formed to be coupled to an audio signal reproducing apparatus.

The apparatus for converting an audio signal includes: a mute unit including a first mute processing unit muting an audio signal at a time when negative pop noise is present based on a predetermined timing and a second mute processing unit muting the audio signal at a time when positive pop noise is present based on the timing.

Advantageous Effects

As described above, according to embodiments of the present invention, a noise component which comes from a power source terminal of an apparatus for converting an audio signal is removed stepwise to transfer power to a converting unit and an amplification unit included in the apparatus for converting the audio signal from the power source terminal, thereby removing power noise.

Even if the effects are not expressly mentioned here, the effects described in the following specification, which are expected by the technical characteristics of the present invention, and their potential effects are treated as described in the specification of the present invention.

DESCRIPTION OF DRAWINGS

FIG. 1 is a diagram illustrating an audio system according to embodiments of the present invention.

FIG. 2 is a block diagram illustrating an apparatus for reproducing an audio signal according to an embodiment of the present invention.

FIG. 3 is a block diagram illustrating an apparatus for converting an audio signal according to an embodiment of the present invention.

FIG. 4 is a perspective view illustrating an apparatus for converting an audio signal according to an embodiment of the present invention.

FIG. 5 is a diagram illustrating a connection unit of an apparatus for converting an audio signal according to an embodiment of the present invention.

FIG. 6 is a view illustrating an apparatus for converting an audio signal according to another embodiment of the present invention.

FIG. 7 is a diagram illustrating a signal flow of an apparatus for converting an audio signal according to an embodiment of the present invention.

FIG. 8 is a diagram illustrating a noise removing unit of an apparatus for converting an audio signal according to an embodiment of the present invention.

FIGS. 9 and 10 illustrate that clocks of an apparatus for converting an audio signal and an apparatus for reproducing the audio signal are synchronized with each other according to embodiments of the present invention.

FIG. 11 is a diagram illustrating a converting unit of an apparatus for converting an audio signal according to an embodiment of the present invention.

FIG. 12 is a diagram illustrating an amplification unit of an apparatus for converting an audio signal according to an embodiment of the present invention.

FIG. 13 is a diagram illustrating a wiring of an apparatus for converting an audio signal according to an embodiment of the present invention.

FIG. 14 is a block diagram illustrating a mute unit of an apparatus for converting an audio signal according to an embodiment of the present invention.

FIG. 15 is a circuit diagram specifically illustrating a mute unit of an apparatus for converting an audio signal according to an embodiment of the present invention.

FIG. 16 is a diagram illustrating pop noise.

BEST MODE

Hereinafter, in describing the present invention, a detailed explanation of known technologies associated with the present invention, which is apparent to those skilled in the art may be omitted to avoid unnecessarily obscuring the subject matter of the present invention and some embodiments of the present invention will be described in detail through illustrative drawings.

FIG. 1 is a diagram illustrating an audio system according to embodiments of the present invention.

Referring to FIG. 1, the audio system 100 includes an audio signal reproducing apparatus 200 and an audio signal converting apparatus 300. The audio signal reproducing apparatus 200 and the audio signal converting apparatus 300 are electrically connected to each other.

The audio signal reproducing apparatus 200 serves to reproduce an audio signal. Examples of the audio signal reproducing apparatus 200 may include a personal computer, a video player, a smart phone, an MP3 player, audio equipment in an electrical apparatus for a vehicle, and the like.

The audio signal reproducing apparatus 300 serves to convert the audio signal from a digital signal into an analog signal. The audio signal converting apparatus 300 receives an audio signal of a digital signal format from the audio signal reproducing apparatus 200 and transmits the audio signal into an analog signal format and then transmits the analog signal to the audio signal reproducing apparatus 200. The audio signal converting apparatus 300 contributes to reproducing digital contents and outputting a high-quality sound source by the audio signal reproducing apparatus 200. That is, the audio signal converting apparatus 300 may be implemented as a Hi-Fi audio module.

In general, a method for determining a sound quality of an audio file is to view a bit rate. This may be measured in units of kilobits per second. For example, the bit rate of a CD sound source may be 1411 kbps and as the bit rate is the higher, a high-quality analog signal may be output. The bit rate may be set according to the sound quality of sound source data. For the sound source data, 128 kbps and 256 kbps may be primarily used and in recent years, a lossless sound source may vary depending on a capacity of a tune itself.

FIG. 2 is a block diagram illustrating an apparatus for reproducing an audio signal according to an embodiment of the present invention.

Referring to FIG. 2, the audio signal reproducing apparatus 200 includes all or some of a signal processing unit 210, a signal storing unit 220, a signal output unit 230, an information display unit 240, a power source unit 250, and a connection unit 260. In the audio signal reproducing apparatus 200, some components among various components exemplarily illustrated in FIG. 2 may be omitted or another component may be additionally included.

The signal processing unit 210 commands to transmit the audio signal stored in the signal storing unit 220 to the audio signal converting apparatus 300, commands to receive the audio signal converted by the audio signal converting apparatus 300, and outputs the converted audio signal to the signal output unit 230. For example, the signal processing unit 210 may be implemented as a microprocessor, etc.

The signal storing unit 220 stores the audio signal. The signal storing unit 220 may be implemented as a memory, a hard disk drive, or a solid state drive. The signal storing unit 220 may be fixed in the audio signal reproducing apparatus 200 and implemented in a separate type scheme like a portable drive.

The information display unit 240 serves to output information computed by the signal processing unit 210 as visual information. The information display unit 240 may display a reproduction list of the audio signal reproducing apparatus 200 or an artist list of the digital contents.

FIG. 3 is a block diagram illustrating an apparatus for converting an audio signal according to an embodiment of the present invention.

Referring to FIG. 3, the audio signal converting apparatus 300 includes all or some of a power source terminal 310, a noise removing unit 320, a clock generating unit 330, a converting unit 340, an amplification unit 350, a mute unit 360, and a connection unit 370. In the audio signal converting apparatus 300, some components among various components exemplarily illustrated in FIG. 3 may be omitted or another component may be additionally included.

A layout structure of the clock generating unit 330, the converting unit 340, the amplification unit 350, and the mute unit 360 in the audio signal converting apparatus 300 may be arbitrarily changed according to a purpose of noise reduction. Locations and a connection relationship of the clock generating unit 330, the converting unit 340, the amplification unit 350, and the mute unit 360 in the audio signal converting apparatus 300 may have a design structure optimized for a flow of data or a signal.

A layout or a design of the audio signal converting apparatus 300 may be set by using hardware or software. In changing the components of the audio signal converting apparatus 300, initialization of the flow of the data or the signal may be required and the initialization may be automatically set by a module embedded in the hardware itself or by software which may be received in a separate Internet or mobile app.

The audio signal converting apparatus 300 may have high power consumption in order to contribute to outputting a high-quality sound source by the audio signal reproducing apparatus 200. The audio signal converting apparatus 300 individually controls the converting unit 340 and the amplification unit 350 to minimize power consumption depending on the use.

The audio signal converting apparatus 300 may be implemented as a module type. There is an advantage in that users easily perform change, replacement, update, etc., of the module type audio signal converting apparatus 300 to easily change the module type audio signal converting apparatus 300 to an audio system which suits a need of the user. A general user using the module type audio signal converting apparatus 300 or a manufacturer which desires gentrification of audio devices, home appliances, and electric components is capable of tuning the audio signal converting apparatus 300 at low cost and may enjoy the same effect as possessing various lineups of audio systems 100.

The audio signal converting apparatus 300 may have a shape in which the audio signal converting apparatus 300 is detachable/attachable from/to the audio signal reproducing apparatus 200 and may be mounted on the audio signal reproducing apparatus 200. The audio signal converting apparatus 300 receives the audio signal stored in the audio signal reproducing apparatus 200 to process the audio signal according to the synchronized clock.

The audio signal converting apparatus 300 and the audio signal reproducing apparatus 200 include connection units which electrically contact each other, respectively. The audio signal is transmitted/received by wire/wireless through the connection units of the audio signal converting apparatus 300 and the audio signal reproducing apparatus 200.

FIG. 4 is a perspective view illustrating an apparatus for converting an audio signal according to an embodiment of the present invention.

Referring to FIG. 4, the audio signal converting apparatus 400 includes a housing 480 and a shield can 490.

The housing 480 is positioned outside at least one of the clock generating unit 430, the converting unit 440, the amplification unit 450, and the mute unit 460 and serves to fix the devices.

The shield can 490 serves to prevent introduction of radiated noise. A material of the shield can 490 may be a material including at least one of nickel silver and stainless. The shield can 490 may be formed to be detachable to the housing 480.

The housing 480 is formed so as to expose at least a part of a connection unit 470 to the outside so that the audio signal converting apparatus 400 electrically contacts the external audio signal reproducing apparatus 200.

The audio signal converting apparatus 400 transmits/receives an electrical signal to/from the audio signal reproducing apparatus 200 by using the connection unit 470. That is, the connection unit 470 is a passage of the electrical signal. The connection unit 470 includes a fastening unit 472 and an electrode 474.

The audio signal converting apparatus 400 may be mechanically mounted on the audio signal reproducing apparatus 200 by using the fastening unit 472. The fastening unit 472 may include a connector of a standardized specification. The fastening unit 472 may have a fastening structure using magnetic force for convenience of the user.

The audio signal converting apparatus 400 may transmit a clock signal to the signal processing unit 210 of the audio signal reproducing apparatus 200 through the connection unit 470 and receive a control signal from the signal processing unit 210. The connection unit 470 may include an insulating material in order to prevent the electric signal from flowing to the air or a body of the user. The structure and the shape of the connection unit 470 may be changed according to the purpose and the shape of the audio signal reproducing apparatus 200.

FIG. 5 is a diagram illustrating a connection unit of an apparatus for converting an audio signal according to an embodiment of the present invention.

An electrode 574 of the connection unit 570 may include a guide shaft 576 operating as a spring and a guide hole 578 capable of transferring the electrical signal into the guide shaft 576. When the guide hole 578 is pressed with force larger than elastic force of the spring, the guide hole 578 may contact the connection unit 260 of the audio signal reproducing apparatus 200. The structure of the electrode 574 may have a similar shape to a pogo pin structure.

When the audio signal converting apparatus 300 is electrically and mechanically connected to the audio signal reproducing apparatus 200, the audio signal converting apparatus 300 checks whether the audio signal converting apparatus 300 electrically contacts the audio signal reproducing apparatus 200. The audio signal converting apparatus 300 may check whether to normally contact the external audio signal reproducing apparatus 200 by using a contact signal and a received signal. The contact signal is a signal for notifying that the audio signal converting apparatus 300 normally contacts with the audio signal reproducing apparatus 200 and the received signal is a signal for notifying that the external communicatable audio signal reproducing apparatus 200 receives the contact signal and prepares for transmitting the audio signal in response to the contact signal, to the audio signal converting apparatus 300. The audio signal converting apparatus 300 may receive the audio signal when normally contacting the audio signal reproducing apparatus 200.

A size of a modularized audio signal converting apparatus may be between 7 to 30 mm. The size of the modularized audio signal converting apparatus may be changed according to a required design and may vary depending on the specification of the connection unit of the audio signal reproducing apparatus 200.

FIG. 6 is a view illustrating an apparatus for converting an audio signal according to another embodiment of the present invention.

The audio signal converting apparatus 600 itself may be modularized and internal components may also be modularized. For example, in the audio signal converting apparatus 600, a converting unit 630 and an amplification unit 640 may be detachable to a base module 610. Reproduction sound qualities of various digital contents may be selected through modularizing the internal components of the audio signal converting apparatus 600.

FIG. 7 is a diagram illustrating a signal flow of an apparatus for converting an audio signal according to an embodiment of the present invention.

Power noise is classified into harmonic noise, pulse type noise, and surge type noise according to a voltage level or a waveform. The harmonic noise as a harmonic component primarily included in a switching frequency of a computer or a switching power source is noise which has a voltage level of several mV to tens of mV and continuously occurs when electrical equipment is turned on/off. The pulse type noise as noise generated when switching a relay or an inductive motor may have a higher voltage level than the harmonic noise and may have peak voltage of thousands of V. The surge type noise is primarily generated on a power line by induction lightening and has a much higher voltage level than other noise, and as a result, the peak voltage may reach tens of thousands of V.

The audio signal converting apparatus has a noise removing unit operating stepwise, a mute unit implemented by a pair of FETs, and a spaced wiring structure in order to remove the power noise.

Referring to FIG. 7, the audio signal converting apparatus includes a power source terminal 710, a plurality of noise removing units 721 to 724, a clock generating unit 730, a converting unit 740, an amplification unit 750, a mute unit 760, and a connection unit 770.

A power source terminal 710 serves to supply electrical energy to the clock generating unit 730, the converting unit 740, the amplification unit 750, and the mute unit 760. A power source may be connected to the power source terminal 710 and the power source may be positioned inside or outside the audio signal converting apparatus. The type of power source may be changed according to characteristics of the audio signal reproducing apparatus. In order to reduce the power noise, the power source terminal 710 may be separated into a plurality of power source terminals. Each of the plurality of separated power source terminals may have an optimized voltage value.

The plurality of noise removing units serves to remove the noise which comes from the power source terminal 710. Referring to FIG. 8, the noise removing units 721 to 724 are individually connected between (i) a single or a plurality of power source terminals 710 and (ii) the clock generating unit 730, the converting unit 740, the amplification unit 750, and the mute unit 760.

The clock generating unit 730 serves to generate a clock signal for determining an operation timing of the audio signal converting apparatus 300. The clock generating unit 730 may generate a Master Clock (MCLK), a Left-Right Clock (LRCK), a Bit Clock (BITCLK), etc. The MCLK means a master clock. The clock generating unit 730 may determine a final operation timing of the audio signal converting apparatus by using the MCLK. The LRCK means a clock for a left (L) channel and a right (R) channel of a digital audio signal. When L channel information is transmitted, the LRCK may be set to 1 and when R channel information is transmitted, the LRCK may be set to 0. The BITCLK means a clock which is transmitted in engagement with a bit which is a basis of the digital signal. The clock generating unit 730 may determine whether the digital signal is 0 or 1 by matching synchronization with a bit clock by using the BITCLK.

Clock signals generated by the clock generating unit 730 are transmitted to the audio signal reproducing apparatus through a connection unit 770. Since the clock generating unit 730 uses a clock generated in a phased lock loop (PLL), the clock generating unit 730 may accurately generate the analog signal. The audio signal converting apparatus 300 directly generates and uses the clocks through the clock generating unit 730 to generate an analog signal with low jitter.

The converting unit 740 serves to convert the digital signal received from the audio signal reproducing apparatus 200 through the connection unit 770 into the analog signal by using synchronized control signals and clock signals.

The converting unit 740 may be implemented as a plurality of modules. In this case, the converting unit 740 is capable of converting a high-quality analog signal through averaging of output noise. However, when the converting unit 740 is implemented as the plurality of modules, power consumption may increase and in this case, such a problem may be solved by individually controlling current of the converting unit 740.

The amplification unit 750 serves to amplify the analog signal which is an output of the converting unit 740. The amplification unit 750 may include a pre-amp for adjusting the analog signal and a power-amp for amplifying the power and may be implemented as an integrated amp in which the pre-amp and the power-amp are combined. However, in the embodiment, the shape of the amplification unit 750 is not limited thereto and may be arbitrarily changed according to the purpose and the function of the audio signal converting apparatus 300.

The mute unit 760 serves to mute the audio signal based on a predetermined timing. The mute unit 760 serves to remove pop noise generated when the power source is turned on/off after the audio signal converting apparatus 300 is mounted on the audio signal reproducing apparatus 200.

The connection unit 770 electrically or mechanically connects the audio signal converting apparatus 300 to the audio signal reproducing apparatus 200 and serves as the passage of the electrical signal between the audio signal converting apparatus 300 and the audio signal reproducing apparatus 200. The connection unit 770 receives the audio signal from the audio signal reproducing apparatus 200 and transmits the received audio signal to the converting unit 740.

FIG. 8 is a diagram illustrating a noise removing unit of an apparatus for converting an audio signal according to an embodiment of the present invention. The noise removing unit serves to remove the noise which comes from the power source terminal.

Referring to FIG. 8, the internal circuit of the noise removing unit includes a voltage input node 810, a bead 820, a first capacitor 830, a low drop out (LDO) regulator 840, a second capacitor 850, and a voltage output node 860.

The noise removing unit may have a circuit structure in which electrical elements are sequentially connected. The circuit structure of the noise removing unit may primarily use the bead 820 for removing high-frequency noise, secondarily use a capacitor 830 having a low serial equivalent resistance value, tertiarily use a low drop out (LDO) regulator 840, and quarternarily use a large-capacitor 850.

The LDO regulator adjusts linearly adjusts the voltage even when supply voltage is very close to output voltage. The LDO regulator has an advantage in that since voltage drop is small and ripple is small, the noise is reduced and since the circuit is simple a price is low.

The voltage input node 810 is connected to each of separated power source terminals or a combination thereof. The respective separated power source terminals or the combination thereof are connected to the plurality of noise removing units 721 to 724, respectively. For example, in order to remove the noise, the respective separated power source terminals or the combination thereof may be set to +3.7 V, +6 V, −5 V, etc. and may further include a DC-DC converter. In this case, the power source may use a potential difference generated due to an ionization difference and include a primary battery which may not be charged and a secondary battery which may be charged. The type of power source may be changed according to characteristics of the audio signal reproducing apparatus.

The voltage output node 860 is connected to at least one of the clock generating unit 730, the converting unit 740, the amplification unit 750, and the mute unit 760. Voltage from which the noise is removed stepwise is illustrated in reference numerals 801, 802, and 803 and it may be determined that the voltage of the voltage output node 860 has a smooth voltage value.

FIGS. 9 and 10 illustrate that clocks of an apparatus for converting an audio signal and an apparatus for reproducing the audio signal are synchronized with each other according to embodiments of the present invention.

Synchronization is to match operation timings of the audio signal converting apparatus 300 and the audio signal reproducing apparatus 200. That is, the synchronization is to unify a reference time of the clock signal so that there is no transition between the clock signal which the converting unit 340 of the audio signal converting apparatus 300 sets as a reference and the clock signal which the signal processing unit 210 of the audio signal reproducing apparatus 200 sets as the reference. The synchronization may mean matching of data in addition to matching the operation timings of the modules.

Referring to FIG. 9, the signal processing unit 210 of the audio signal reproducing apparatus 200 transmits frequency information on the quality of the audio signal to the clocking generating unit 330 of the audio signal converting apparatus 300. The clock generating unit 330 of the audio signal converting apparatus 300 generates a first clock signal having a predetermined frequency by receiving the frequency information and/or control signal from the signal processing unit 210 of the audio signal reproducing apparatus 200. For example, the clock generating unit 330 generates the Master Clock (MCLK), the Left-Right Clock (LRCK), and the Bit Clock (BITCLK) as the first clock signal depending on the frequency information. The audio signal reproducing apparatus 200 and the audio signal converting apparatus 300 synchronize with the first clock signal.

The signal processing unit 210 of the audio signal reproducing apparatus 200 generates the control signal which synchronizes with the first clock signal.

Since the clock generated in the phased lock loop (PLL) in the clock generating unit 330 is used, an accurate analog signal may be generated. That is, since the clocks generated in the phased lock loop in the audio signal generating apparatus 200 are not used, clocks which are not influenced according to a use amount of a system core are used to generate the clock signal having the low jitter. The phased lock loop in the clock generating unit 330 serves to control the output signal by using a phase difference with a feedback signal in the input signal and the output signal and adjusts the frequency of the output signal according to the input signal.

The signal processing unit 210 of the audio signal reproducing apparatus 200 receives the clock signal and/or the control signal from the clock generating unit 330 of the audio signal converting apparatus 300 and transmits a control signal for determining a final operation timing between the apparatuses to the converting unit 340 of the audio signal converting apparatus 300.

The converting unit 340 receives the clock signals from the clock generating unit 330, receives the control signal from the clock generating unit 330 and the signal processing unit 210, and converts the digital audio signal received from the signal processing unit 210 into the analog audio signal.

The signal processing unit 210 detects whether the clock generating unit 330 is abnormal. When the clock generating unit 330 is abnormal, the clock generating unit 330 determines an operation state according to the control signal from the signal processing unit 210 of the audio signal reproducing apparatus 200. The clock generating unit 330 performs an initialization process or terminates an operation according to a control signal including an initialization signal and a disable signal.

When the operation of the clock generating unit 330 is terminated, the signal processing unit 210 generates a second clock signal as illustrated in FIG. 10. The audio signal reproducing apparatus 200 and the audio signal converting apparatus 300 synchronize with the second clock signal.

FIG. 11 is a diagram illustrating a converting unit of an apparatus for converting an audio signal according to an embodiment of the present invention. The converting unit 740 serves to convert the digital signal received from the audio signal reproducing apparatus into the analog signal by using synchronized control signals and clock signals.

The converting unit 740 may be implemented as the plurality of modules. The converting unit 740 is capable of converting a high-quality analog signal through averaging of output noise. However, when the converting unit 740 is implemented as the plurality of modules, power consumption may increase and in this case, such a problem may be solved by individually controlling current of the converting unit 740.

The converting unit 740 includes a power source terminal 1110, a clock signal input unit 1120, a data input unit 1130, a converting unit 1140, a control signal receiving unit 1150, and an analog signal output unit 1160. The power source terminal 1110 of the converting unit 740 is connected to the noise removing unit 722. The clock signal input unit 1120 receives the first clock signal generated by the clock generating unit 330. The data input unit 1130 receives the audio signal synchronized in the signal processing unit 210. The control signal receiving unit 1150 receives the frequency information and/or the control signal from the signal processing unit 210. The converting unit 1140 serves to convert a discrete signal synchronized in the signal processing unit 210 into the analog signal and output the analog signal. The analog signal output unit 1160 outputs the converted analog signal and transmits the output analog signal to the amplification unit 750.

The converting unit 1140 generates a reference clock signal according to the received frequency information and compares the generated reference clock signal with the first clock signal and calculates an error to correct the first clock signal. Meanwhile, the converting unit 1140 generates the reference clock signal according to the received frequency information and compares the generated reference clock signal with the second clock signal and calculates the error to correct the second clock signal.

FIG. 12 is a diagram illustrating an amplification unit of an apparatus for converting an audio signal according to an embodiment of the present invention.

The amplification unit 750 may include a pre-amp for adjusting the analog signal and a power-amp for amplifying the power and may be implemented as an integrated amp in which the pre-amp and the power-amp are combined. However, in the embodiment, the shape of the amplification unit 750 is not limited thereto and may be arbitrarily changed according to the purpose and the function of the audio signal converting apparatus 300.

The amplification unit 750 includes a power source terminal 1210, an analog signal input unit 1220, an amplification unit 1230, and an amplification signal output unit 1240. The power source terminal 1210 of the amplification unit 750 is connected to the noise removing unit 723. The analog signal input unit 1220 receives the analog signal output from the converting unit 740 through a plurality of channels. The total number of channels input into the analog signal input unit 1220 is four and the channels include two RIGHT channels and two LEFT channels. The amplification unit 1230 serves to increase the power of the analog signal. The amplification signal output unit 1240 outputs the amplified analog signal. The total number of channels output from the amplification signal output unit 1240 is two and the channels include the RIGHT channel and the LEFT channel.

The amplification unit 1230 may have a structure in which the amplification unit 1230 is constituted by a plurality of OP-AMP elements to increase a gain stepwise. The gain of each OP-AMP element may be an optimized value considering the noise and may have a feedback circuit including a resistance element between respective amplification elements.

FIG. 13 is a diagram illustrating a wiring of an audio signal converting apparatus according to an embodiment of the present invention and includes the converting unit 740 and the amplification unit 750 of FIG. 7.

Left and right output channels 1330 of the amplification signal output unit 1310 may have a structure to cover the left and right output channels 1330 with ground (GND) 1320 in order to prevent interference of the signal. The amplification signal output unit uses cross talk as a reference for evaluating an interference degree of the signals of the left and right output channels and this means a channel separation degree and indicates the interference degree of the signals in the left and right channels of the amplification signal output unit. The amplification signal output unit has the structure to cover the left and right output channels with the GND to enhance the channel separation degree.

The converting unit 740 may have a spacing structure in order to prevent duplication of a part where digital noise may be induced on the internal circuit pattern. A digital signal line and an analog signal line of the converting unit 740 are maximally spaced apart from each other. In the spacing structure, the digital signal line and the analog signal line may be spaced apart from each other on a 2-dimensional plane or spatially spaced in different layers in a 3-dimensional space. In this case, a spacing distance may have a predetermined value or more by considering the size and a reproduction sound quality of the audio signal converting apparatus 300.

The amplification unit 750 may have a design optimized to the converting unit 430 in order to reduce the noise. Further, the wiring of the internal circuit of the amplification unit 440 may have a maximum spacing structure in order to prevent the duplication of the part where the digital noise may be induced. The spacing distance may have a predetermined value or more by considering the size and the reproduction sound quality of the audio signal converting apparatus 300.

FIG. 14 is a block diagram illustrating a mute unit of an apparatus for converting an audio signal according to an embodiment of the present invention, FIG. 15 is a circuit diagram specifically illustrating a mute unit of an apparatus for converting an audio signal according to an embodiment of the present invention, and FIG. 16 is a diagram illustrating pop noise.

The mute unit 760 may have a configuration optimized to a high output and include a timing setting unit 1410 and a timing adjusting unit 1420 in order to adjust the timing.

When the audio signal having the high output is input, the timing setting unit 1410 serves to primarily set a mute timing with respect to the audio signal. Specifically, the timing setting unit 1410 serves to set an overall mute timing. The timing setting unit 1410 may serve to set the overall mute timing by setting the mute timing over the entire input audio signal.

The timing adjusting unit 1420 serves to secondarily adjust the mute timing with respect to the audio signal in which the mute timing is primarily set by the timing setting unit 1410. Specifically, the timing setting unit 1420 serves to set a precise timing of the mute. The timing adjusting unit 1420 may serve to set the precise timing of the mute by adjusting the mute timing with respect to each part of the audio signal in which the mute timing is set.

When the mute unit 760 includes only the timing setting unit 1410, there may be a problem in that pop noise is rather generated when the mute unit 760 mutes the audio signal. It is preferable that the mute unit 760 includes at least one timing adjusting unit 1420 together with the timing setting unit 1410.

When the audio signal having the high output is input, a first mute processing unit 1430 serves to primarily mute the audio signal based on the mute timing set and adjusted by the timing setting unit 1410 and the timing adjusting unit 1420.

The first mute processing unit 1430 serves to remove the pop noise generated when the power source of the digital signal converting apparatus is turned on/off by muting the audio signal at a predetermined mute timing.

The first mute processing unit 1430 primarily mutes the audio signal to remove pop noise related to the audio signal, in particular, negative pop noise.

When the input audio signal is primarily muted at a predetermined timing by the first mute processing unit 1430, the second mute processing unit 1440 serves to secondarily mute the audio signal based on the mute timing set and adjusted by the timing setting unit 110 and the timing adjusting unit 120.

The second mute processing unit 1440 mutes the audio signal at each predetermined timing together with the first mute processing unit 1430 to remove the pop noise. In this case, the second mute processing unit 1440 may remove positive pop noise related to the audio signal.

Meanwhile, in the embodiment, the mute unit 760 may be provided only with the first mute processing unit 1430. In this case, the first mute processing unit 1430 may serve to remove even the positive pop noise together with the negative pop noise.

Referring to FIG. 15, the timing setting unit 110 includes a first resistor 111 and a first capacitor 112. In the embodiment, the first resistor 111 and the first capacitor 112 have a structure in which the first resistor 111 and the first capacitor 112 are connected in parallel.

The first resistor 111 serves to adjust output voltage in connection with a collector of a first transistor 201.

In the case of the first capacitor 112, one side is connected to the collector of the first transistor 201 and the other side is connected to the ground GND.

Meanwhile, an emitter of the first transistor 201 is connected to the ground GND and a base of the first transistor 201 is connected to a mute signal input unit 211 that mutes the audio signal in the audio signal reproducing apparatus.

The mute unit 760 may further include a second resistor 221 connected to the first transistor 201 in parallel. In the case of the second resistor 221, one side is connected to the mute signal input unit 211 and the other side is connected to the ground GND. The second resistor 221 corresponds to a protection resistor.

As described above, in the present invention, the mute unit 760 may include at least two timing adjusting units 1420.

Hereinafter, by considering such a point, a first timing adjusting unit 120a and a second timing adjusting unit 120b will be separately described.

The first timing adjusting unit 120a includes a third resistor 121 and second capacitor 122. In the embodiment, the third resistor 121 and the second capacitor 122 have a structure in which third resistor 121 and the second capacitor 122 are connected in series.

The third resistor 121 serves to adjust the output voltage in connection with the collector of the second transistor 202.

In the case of the second capacitor 122, one side is connected to the collector of the second transistor 202 and the other side is connected to the ground GND.

Meanwhile, the emitter of the second transistor 202 is connected to Vcc and the base of the second transistor 202 is connected to the timing setting unit 110.

The mute unit 760 may further include a fourth resistor 222 connected to the third transistor 201 in parallel. The fourth resistor 222 serves to adjust the output voltage. In the case of the fourth capacitor 222, one side is connected to the collector of the second transistor 202 and the other side is connected to the ground GND.

The mute unit 760 may further include a third capacitor 231 connected to the timing setting unit 110. In the case of the third capacitor 231, one side is connected to the first resistor 111 of the timing setting unit 110 and the other side is connected to the ground GND.

The second timing adjusting unit 120b includes a fifth resistor 123 and a fourth capacitor 124. In the embodiment, the fifth resistor 123 and the fourth capacitor 124 have a structure in which the fifth resistor 123 and the fourth capacitor 124 are connected in series. The fifth resistor 123 serves to adjust the output voltage in connection with the first timing adjusting unit 120a. In the case of the fourth capacitor 124, one side is connected to the fifth resistor 123 and the other side is connected to the ground GND.

The mute unit 760 may further include a fifth capacitor 232 and a sixth capacitor 233 connected to the second timing adjusting unit 120b. In the embodiment, the fifth capacitor 232 and the sixth capacitor 233 have a structure in which the fifth capacitor 232 and the sixth capacitor 233 are connected in parallel. In the case of the fifth capacitor 232, one side is connected to the fifth resistor 123 of the second timing adjusting unit 120b and the other side is connected to the second mute processing unit 1440. In the case of the sixth capacitor 233, one side is connected to the fifth resistor 123 of the second timing adjusting unit 120b and the other side is connected to the second mute processing unit 1440 like the fifth capacitor 232.

In the embodiment, the second mute processing unit 1440 may be implemented as dual FETs. In this case, the fifth capacitor 232 and the sixth capacitor 233 may be connected to the FETs of the second mute processing unit 1440, respectively. The fifth capacitor 232 and the sixth capacitor 233 may be provided in the mute unit 760 in an opened form.

The first mute processing unit 1430 includes a first field effect transistor (FET) 131 and a second FET 132. When the first mute processing unit 1430 is implemented as a single FET, it is difficult to completely remove the pop noise and in particular, it is difficult to solve the pop noise which leaks to a minus side. The pop noise as noise generated when supplying the power or stopping the supply of the power means noise generated due to the voltage of the capacitor charged when a circuit having a capacitor with charged voltage is connected to another electrical circuit. In FIG. 16, negative pop noise 1610 and positive pop noise 1620 are illustrated. The negative pop noise is noise which leaks to the minus side.

The first mute processing unit 1430 provided in the mute unit 760 primarily mutes the input audio signal at a predetermined mute timing to remove the negative pop noise 1610.

In the embodiment, in order to solve such a problem, the first mute processing unit 1430 is implemented as the dual FETs. Further, in the embodiment, such a problem is solved by arranging the first FET 131 and the second FET 132 so that a drain and a source of the first FET 131 and the drain and the source of the second FET 132 face each other.

When the audio signal received through a right input terminal (AUDIO_R_IN) 212 is input into a gate of the first FET 131, the first FET 131 serves to mute the audio signal according to the timings determined by the timing setting unit 110, the first timing adjusting unit 120a, and the second timing adjusting unit 120b and transmit the muted audio signal to the second mute processing unit 1440.

Similarly, when the audio signal received through a left input terminal (AUDIO_L_IN) 213 is input into the gate of the second FET 132, the second FET 132 serves to mute the audio signal according to the timings determined by the timing setting unit 110, the first timing adjusting unit 120a, and the second timing adjusting unit 120b and transmit the muted audio signal to the second mute processing unit 1440.

The second mute processing unit 1440 includes a third FET 141 and a fourth FET 142. The second mute processing unit 1440 is implemented as dual FETs like the first mute processing unit 1430. Further, the third FET 141 and the fourth FET 142 are arranged so that the drain and the source of the third FET 141 and the drain and the source of the fourth FET 142 face each other.

When the mute-processed audio signal is input from the first FET 131, the third FET 141 serves to mute the audio signal according to the timings determined by the timing setting unit 110, the first timing adjusting unit 120a, and the second timing adjusting unit 120b and output the muted audio signal through a right output terminal (AUDIO_R_OUT) 214.

Similarly, when the mute-processed audio signal is input from the second FET 132, the fourth FET 142 serves to mute the audio signal according to the timings determined by the timing setting unit 110, the first timing adjusting unit 120a, and the second timing adjusting unit 120b and output the muted audio signal through a left output terminal (AUDIO_L_OUT) 215.

The second mute processing unit 1440 provided in the mute unit 760 secondarily mutes the audio signal primarily mute-processed by the first mute processing unit 1430 according to a determined mute timing to remove the positive pop noise 1620.

Constituent elements included in the audio signal converting apparatus are separately illustrated in FIG. 3, but a plurality of constituent elements may be combined with each other and implemented as at least one module. The constituent elements are connected to a communication path connecting a software module or a hardware module inside the apparatus and operate organically with each other. The constituent elements communicate using one or more communication buses or signal lines.

The audio signal converting apparatus may be implemented in a logic circuit by hardware, firmware, software, or a combination thereof, and may be implemented using a universal or special purpose computer. The apparatus may be implemented using a hardwired device, a field programmable gate array (FPGA), an application specific integrated circuit (ASIC), or the like. In addition, the apparatus may be implemented as a System on Chip (SoC) including one or more processors and controllers.

The audio signal reproducing apparatus may be implemented as software, hardware, or a combination type thereof in a computing device or a server having hardware components. The computing device or server may mean various devices which include all or some of a communication device such as a communication modem for performing communication with various devices or wired/wireless communication networks, a memory for storing data for executing a program, and a microprocessor for performing a computation and commanding by executing a program.

The operations according to the embodiments are implemented in a form of a program command which may be performed through various computer means and may be recorded in the computer readable medium. The computer readable medium represents any medium that participates in providing instructions to a processor for execution. The computer readable medium may include a program command, a data file, or a data structure or a combination thereof. For example, the computer readable medium may include a magnetic medium, an optical recording medium, a memory, and the like. A computer program may be distributed on a networked computer system so that a computer readable code may be stored and executed in a distributed manner. Functional programs, codes, and code segments for implementing the embodiment may be easily inferred by programmers in the art to which the embodiment belongs.

The embodiments are for describing the technical spirit of the embodiment, and the scope of the technical spirit of the embodiment is not limited by the embodiment. The protection scope of the embodiment should be construed based on the following appended claims and it should be appreciated that the technical spirit included within the scope equivalent to the claims belongs to the embodiment.

The invention claimed is:

1. A device for removing noise of a power source, the device comprising:
a noise removing unit removing a noise component which comes from a power source terminal of an audio signal converting apparatus stepwise and transferring power to a converting unit and an amplification unit included in the audio signal converting apparatus from the power source terminal,
wherein the noise removing unit includes a primary noise removing unit, a secondary noise removing unit, a tertiary noise removing unit, and a quarternary noise removing unit,
wherein a first end of the primary noise removing unit is connected to a voltage input node, a second end of the primary noise removing unit is connected to a first end of the secondary noise removing unit and a first end of the tertiary noise removing unit,
wherein a second end of the secondary noise removing unit is connected to ground,
wherein a second end of the tertiary noise removing unit is connected to a first end of the quaternary noise removing unit and a voltage output node, and
wherein a second end of the quaternary noise removing unit is connected to the ground.

2. The device of claim 1, wherein the power source terminal is separated into a plurality of power source terminals and there are a plurality of noise removing units, and the plurality of noise removing units are connected to the plurality of separated power source terminals, respectively to individually remove the noise component.

3. The device of claim 2, wherein a first noise removing unit is connected between the converting unit and a first power source terminal and a second noise removing unit is connected between the amplification unit and a second power source terminal.

4. The device of claim 1, wherein the primary noise removing unit uses a bead for removing high-frequency noise.

5. The device of claim 1, wherein the secondary noise removing unit uses a capacitor having a serial equivalent resistance value lower than a predetermined value.

6. The device of claim 1, wherein the tertiary noise removing unit uses a low drop out (LDO) regulator.

7. The device of claim 1, wherein the quarternary noise removing unit uses a capacitor of a larger capacity than a predetermined value.

8. The device of claim 1, further comprising:
a mute unit including a first mute processing unit muting an audio signal at a time when negative pop noise is present based on a predetermined timing and a second mute processing unit muting the audio signal at a time when positive pop noise is present based on the timing,
wherein the first mute processing unit is implemented as dual FETs including a first FET and a second FET, the first FET and the second FET are arranged so that a drain and a source of the first FET and a drain and a source of the second FET face each other, and
wherein the second mute processing unit is implemented as dual FETs including a third FET and a fourth FET, the third FET and the fourth FET are arranged so that a drain and a source of the third FET and a drain and a source of the fourth FET face each other.

9. An apparatus for converting an audio signal, the apparatus comprising:
a power source terminal;
a converting unit converting, when a digital audio signal is input, the digital audio signal into an analog audio signal;
a clock generating unit determining an operation timing when converting the digital audio signal into the analog audio signal based on the digital audio signal;
an amplification unit amplifying the analog audio signal; and
a noise removing unit removing a noise component which comes from the power source terminal stepwise and transferring power to the clock generating unit, the converting unit, and the amplification unit from the power source terminal,
wherein the noise removing unit includes a primary noise removing unit, a secondary noise removing unit, a tertiary noise removing unit, and a quarternary noise removing unit,
wherein a first end of the primary noise removing unit is connected to a voltage input node, a second end of the primary noise removing unit is connected to a first end of the secondary noise removing unit and a first end of the tertiary noise removing unit, wherein a second end of the secondary noise removing unit is connected to ground, wherein a second end of the tertiary noise removing unit is connected to a first end of the quaternary noise removing unit and a voltage output node, and wherein a second end of the quaternary noise removing unit is connected to the ground.

10. The apparatus of claim 9, wherein the audio signal converting apparatus is implemented as a module type and formed to be coupled to an audio signal reproducing apparatus.

11. The apparatus of claim 9, wherein the power source terminal is separated into a plurality of power source terminals and there are a plurality of noise removing units, and the plurality of noise removing units are connected to the plurality of separated power source terminals, respectively to individually remove the noise component.

12. The apparatus of claim 9, further comprising:

a mute unit including a first mute processing unit muting an audio signal at a time when negative pop noise is present based on a predetermined timing and a second mute processing unit muting the audio signal at a time when positive pop noise is present based on the timing, wherein the first mute processing unit is implemented as dual FETs (Field Effect Transistor) including a first FET and a second FET, the first FET and the second FET are arranged so that a drain and a source of the first FET and a drain and a source of the second FET face each other, and wherein the second mute processing unit is implemented as dual FETs including a third FET and a fourth FET, the third FET and the fourth FET are arranged so that a drain and a source of the third FET and a drain and a source of the fourth FET face each other.

* * * * *